(12) United States Patent
Xu et al.

(10) Patent No.: US 9,613,807 B2
(45) Date of Patent: Apr. 4, 2017

(54) METHODS FOR FABRICATING INTEGRATED CIRCUITS USING DIRECTED SELF-ASSEMBLY CHEMOEPITAXY

(71) Applicant: GLOBALFOUNDRIES, Inc., Grand Cayman (KY)

(72) Inventors: Ji Xu, Watervliet, NY (US); Gerard Schmid, Guilford, CT (US); Richard A. Farrell, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/692,359

(22) Filed: Apr. 21, 2015

(65) Prior Publication Data

US 2016/0035565 A1 Feb. 4, 2016

Related U.S. Application Data

(60) Provisional application No. 62/030,148, filed on Jul. 29, 2014.

(51) Int. Cl.
*H01L 21/02* (2006.01)
*H01L 21/033* (2006.01)
*H01L 21/027* (2006.01)

(52) U.S. Cl.
CPC ...... *H01L 21/0337* (2013.01); *H01L 21/0271* (2013.01); *H01L 21/0274* (2013.01); *H01L 21/02118* (2013.01)

(58) Field of Classification Search
CPC .......... H01L 21/02296; H01L 21/0231; H01L 21/64; H01L 21/70; H01L 21/702; H01L 21/71

See application file for complete search history.

(56) References Cited

U.S. PATENT DOCUMENTS

2014/0287083 A1* 9/2014 Gao ...................... G03F 7/0035
425/385

* cited by examiner

*Primary Examiner* — Cheung Lee
(74) *Attorney, Agent, or Firm* — Lorenz & Kopf, LLP

(57) ABSTRACT

Methods for directed self-assembly (DSA) using chemoepitaxy in the design and fabrication of integrated circuits are disclosed herein. An exemplary method includes forming an A or B-block attracting layer over a base semiconductor layer, forming a trench in the A or B-block attracting layer to expose a portion of the base semiconductor layer, and forming a neutral brush or mat or SAMs layer coating within the trench and over the base semiconductor layer. The method further includes forming a block copolymer layer over the neutral layer coating and over the A or B-block attracting layer and annealing the block copolymer layer to form a plurality of vertically-oriented, cylindrical structures within the block copolymer layer.

8 Claims, 1 Drawing Sheet

METHODS FOR FABRICATING INTEGRATED CIRCUITS USING DIRECTED SELF-ASSEMBLY CHEMOEPITAXY

CROSS-REFERENCE TO RELATED APPLICATION

This application claims the benefit of priority to U.S. Provisional Patent Application Ser. No. 62/030,148, filed on Jul. 29, 2014, the contents of which are herein incorporated by reference in their entirety.

TECHNICAL FIELD

Embodiments of the present disclosure are directed to methods for fabricating integrated circuits. More particularly, embodiments of the present disclosure are directed to methods for directed self-assembly (DSA) using chemoepitaxy in the design and fabrication of integrated circuits.

BACKGROUND

An integrated circuit device typically includes a network of circuits that are formed over a substrate. The device may include several layers of circuit wiring, with various interconnects being used to connect these layers to each other and any underlying transistors. Generally, as a part of the manufacturing process, vias or contact holes are formed, which are transferred to another layer and then filled with a metal to form interconnects, so that the various layers of circuitry are in electrical communication with each other. Prior art methods of forming interconnects generally rely on a series of lithographic and etching steps to define the positions and dimensions of the vias, which in turn define the positions and dimensions of the corresponding interconnects. To this end, photoresist materials and hard masks may be employed. However, the dimensions of features formed using conventional optical lithography techniques for volume manufacturing (e.g., 193 nm dry and immersion lithography) have reached the resolution limit of the lithographic tools.

The creation of vias with smaller critical dimensions (CDs), tighter pitches, and better CD uniformity is one of major challenges for future technology nodes. However, printing such via patterns beyond the 22 nm node is expected to be difficult using conventional optical lithography, even with expensive and complicated double patterning processes, resolution enhancement technology (computational lithography), and severe layout design restrictions. Unfortunately, no alternative non-optical lithographic technique with higher resolution capabilities, such as electron-beam lithography or extreme ultraviolet lithography (EUV), appears to be ready for high volume manufacturing in the near future. While electron-beam direct write lithography is capable of very high resolution, it is a direct-write technique and cannot achieve the necessary wafer throughput levels to make it viable for volume manufacturing. EUV lithography tools have been under development for many years. However, many challenges associated with the source, collection optics, masks, and resists still remain and will likely delay any practical implementation of EUV lithography for several years.

Block copolymer (BCP) patterning has attracted attention as a possible solution to the problem of creating patterns with smaller dimensions. Under the right conditions, the blocks of such copolymers phase separate into microdomains (also known as "microphase-separated domains" or "domains") to reduce the total free energy, and in the process, nanoscale features of dissimilar chemical composition are formed. The ability of block copolymers to form such features recommends their use in nanopatterning, and to the extent that features with smaller CDs can be formed, this should enable the construction of features that would otherwise be difficult to print using conventional lithography. However, without any guidance from the substrate, the microdomains in a self-assembled block copolymer thin film are typically not spatially registered or aligned.

To address the problem of spatial registration and alignment, directed self-assembly (DSA) has been used. This is a method that combines aspects of self-assembly with a lithographically-defined substrate, known as a guiding pattern, to control the spatial arrangement of certain self-assembled BCP domains. One DSA technique is graphoepitaxy, in which self-assembly is guided by topographical features of lithographically pre-patterned substrates. BCP graphoepitaxy provides sub-lithographic, self-assembled features having a smaller characteristic dimension than that of the prepattern itself. Another DSA technique is chemoepitaxy, in which hexagonally arranged dots with negligible topography but a well-defined chemical contrast with the neutral background guides the hexagonal packing of BCP microdomains through DSA.

In current practice, however, both graphoepitaxy and chemoepitaxy suffer from several drawbacks. With graphoepitaxy, the filling conditions of the BCP are critical to the DSA result. Non-optimal BCP filling conditions (such as over-filling or under-filling) will lead to un-desired morphology from DSA and hence defects through pattern transfer. To obtain uniform filling conditions across the wafer, the pattern features (such as contact holes and vias) need to be evenly distributed, which requires strict control of pattern pitch and hence limits the flexibility of design. Further, the pattern features need to have vertical sidewall angle for proper DSA and good thermal stability to endure the DSA annealing process, which severely limits the selection of materials and hence raises the cost of materials. With chemoepitaxy, the current approach guides the hexagonal packing of BCP microdomains thru DSA, as noted above. Accordingly, the post-DSA features are limited to one pitch with one packing symmetry (hexagonal packing), which likewise has severely-limited design flexibility.

As such, what is needed in the art is a simple, cost effective method for directed self-assembly process that overcomes the problems encountered in prior art methods. In particular, it is desirable to provide DSA methods that are less sensitive to filling conditions and material selections, and that allow for varied pitches and design configurations. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Methods for directed self-assembly (DSA) using chemoepitaxy in the design and fabrication of integrated circuits are disclosed herein. In one embodiment, an exemplary method includes forming an A or B-block attracting layer over a base semiconductor layer, forming a trench in the A or B-block attracting layer to expose a portion of the base semiconductor layer, and forming a neutral brush coating within the trench and over the base semiconductor layer. The method further includes forming a block copolymer layer over the neutral brush coating and over A or B-block attracting layer and annealing the block copolymer layer to form a plurality of vertically-oriented, cylindrical structures within the block copolymer layer.

In another embodiment, an exemplary method includes forming a photoresist material layer over a base semiconductor layer, forming a patterned opening in the photoresist material layer in the shape of a trench to expose a portion of the base semiconductor layer, and forming a neutral brush coating within the trench over the base semiconductor layer and over the photoresist material layer. The method further includes removing the photoresist material layer and the neutral brush coating thereover, while leaving the neutral brush coating within the trench over the base semiconductor layer in place, forming a block copolymer layer over the neutral brush coating and over the base semiconductor layer, and annealing the block copolymer layer to form a plurality of vertically-oriented, cylindrical structures within the block copolymer layer.

In yet another embodiment, an exemplary method includes forming a neutral brush coating over a portion of a base semiconductor layer, forming a block copolymer layer over the neutral brush coating and over the base semiconductor layer not having the base semiconductor layer formed thereover, and annealing the block copolymer layer to form a plurality of vertically-oriented, cylindrical structures over the neutral brush coating and horizontally oriented, lamellae-like morphology over the base semiconductor layer not having the base semiconductor layer formed thereover.

BRIEF DESCRIPTION OF THE FIGURES

The present disclosure will hereinafter be described in conjunction with the following drawing figures, wherein like numerals denote like elements, and wherein.

DETAILED DESCRIPTION

Figures 1, 2:
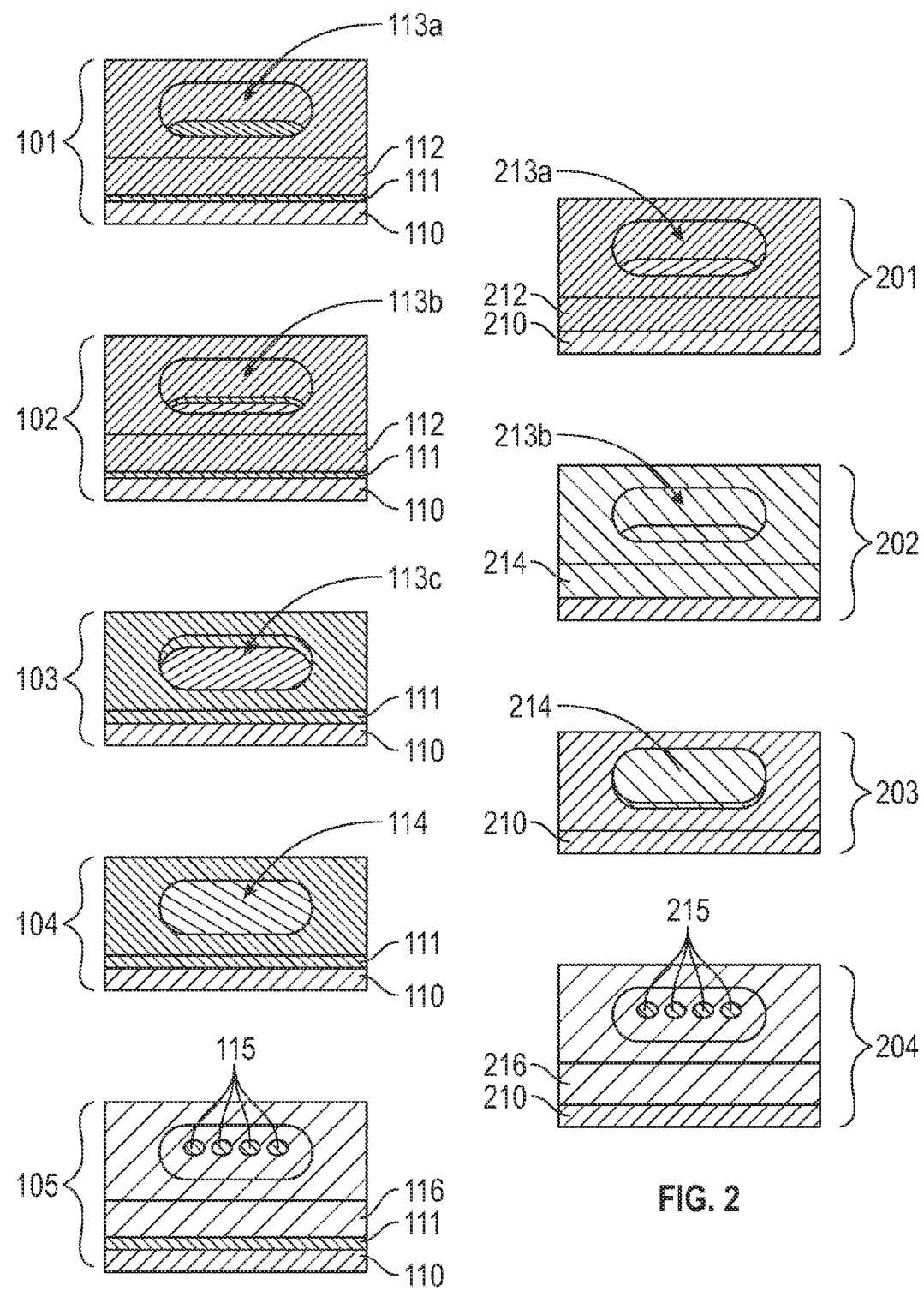
FIG. 1 is a process flowchart illustrating one exemplary embodiment of a method for directed self-assembly (DSA) using chemoepitaxy in the design and fabrication of integrated circuits.
FIG. 2 is a process flowchart illustrating another exemplary embodiment of a method for directed self-assembly (DSA) using chemoepitaxy in the design and fabrication of integrated circuits.

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element. Furthermore, there is no intention to be bound by any expressed or implied theory presented in the preceding technical field, background, brief summary, or the following detailed description.

The disclosed embodiments utilize a new chemoepitaxy approach with zero or negligible topography on the guiding pattern, so the prior art problems associated with graphoepitaxy (filling condition variation, limited selection of materials as the confinement contact holes and vias, etc.) are eliminated. Further, by controlling the wetting condition of the BCP over the chemical patterns, the morphology/orientation of the BCP microdomains after DSA can be locally controlled, so the pitch and location of the post-DSA features can be varied as required by the design. Accordingly, the design flexibility is hence greatly enhanced.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various process steps related to the deposition of the photoresist mask, the patterning thereof, and the deposition of a self-assembly material is well-known in the context of DSA schema, and as such, in the interest of brevity, these steps will only be mentioned briefly herein without providing the well-known process details.

Turning now to the Figures, FIG. 1 is a process flowchart illustrating one exemplary embodiment of a method for directed self-assembly (DSA) using chemoepitaxy in the design and fabrication of integrated circuits. In particular, FIG. 1 shows a series of nanoscale design features 101-105 that show various steps in the fabrication of an integrated circuit. With attention first to nanoscale feature 101, a base layer 110 is initially provided. Base layer 110 provides a support base on which the DSA patterning may occur. For example, in some embodiments, base layer 110 is a combination of a plurality of individual layers. These layers may include, for example, a semiconductor substrate, an organic planarization layer (OPL), and an anti-reflective coating (ARC) layer. With regard to the semiconductor substrate, briefly, the semiconductor substrate is defined to mean any construction formed of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate may further include a plurality of isolation features (not shown), such as shallow trench isolation (STI) features or local oxidation of silicon (LOCOS) features. The isolation features may define and isolate the various microelectronic elements (not shown), also referred to herein as active integrated circuit structures. Disposed on the semiconductor substrate may be the aforementioned organic planarization layer (OPL). Examples of suitable materials for the organic planarization layer include JSR NFC series, HM series, or ShinEtsu ODL series. In one embodiment, OPL is ODL-401, commercially available from ShinEtsu Chemical, Co., Ltd. In some embodiments, OPL has a thickness ranging from about 20 nanometers to about 100 nanometers. In some embodiments, the OPL has a thickness ranging from about 45 nanometers to about 65 nanometers. The OPL serves to create a more level surface patterning. It may also have some optically absorbing components, and thus may also behave like an antireflective coating. It may also have some etch resistant elements, and thus may also behave like a hard mask. Furthermore, disposed on the OPL may be the aforementioned antireflective coating (ARC) layer. In some embodiments, the antireflective coating layer is a silicon-based antireflective coating (SiARC). In some embodiments, a SiARC layer having a thickness from about 10 nanometers to about 40 nanometers is used. In some embodiments, a SiARC layer having a thickness from about 15 nanometers to about 25 nanometers is used.

With continued reference to FIG. 1, nanoscale feature 101, disposed on the base layer 110 may be a layer 111 of an A-block or a B-block attracting layer (e.g.: cross-linked poly(methyl methacrylate) (x-PMMA), or PMMA brush, or self-assembled monolayer (SAM) of organic molecules that attracts PMMA). More broadly, regarding the A-block or the B-block attracting layer, the concept of this disclosure is applicable to a broad range of BCP systems, including but not limited to (1) diblock copolymers: PS-b-PMMA, PS-b-PDMS, PS-b-PI, PS-b-PEO, PS-b-PLA, PS-b-P2VP, PS-b-P4VP, etc.; (2) triblock copolymers: PS-b-PI-b-PMMA, PS-b-PI-b-PVP, etc.; and (3) blends of these systems, such as PS-b-PMMA blended with homopolymer PS, PS-b-PMMA blended with PS-b-PEO, etc. A or B-block attracting layer 111 may be provided to a thickness of about 5 nanometers to about 50 nanometers, for example from about 20 nanometers to about 40 nanometers. Due to the strongly preferential interaction between A or B-block (which is a component of the BCP to be used, as described in greater detail below) and A or the B-block attracting layer, the BCP to be deposited will form a horizontally oriented, lamellae-like morphology on the A or B-block attracting layer. Disposed over the A or B-block attracting layer 111 may be provided a photoresist material layer 112. The photoresist material layer 112 is then patterned by exposure to a light source using known photolithographic processes. Any type of lithography may be employed: for example, 193 nm dry or immersion, EUV, e-beam, and others known in the art. The patterning is performed so as to expose the photoresist material layer 112 in an area that is generally ovular in shape. The patterning process results in an ovular trench 113a formed within the photoresist material layer 112, thereby exposing an upper surface of the A or B-block attracting layer 111 in an ovular area corresponding to the trench 113a.

Turning now to FIG. 1, nanoscale feature 102, the integrated circuit fabrication process using DSA continues with an etching of the A or B-block attracting layer within the trench 113a. The result of such etching is to expose the base layer 110 in an ovular area within the resulting deepened trench, now referred to as trench 113b. Any etching process, such as wet or dry etching, selective to the A or B-block attracting layer of layer 111 may be employed. Thereafter, as shown in nanoscale feature 103, the remaining photoresist material layer 112 may be removed using known rinsing or ashing techniques, as is well within the purview of the skilled artisan. With the removal layer photoresist layer 112, what remains of the trench is within the A or B-block attracting layer 111, and the reduced-height trench in feature 103 is given the reference numeral 113c.

With continued reference to FIG. 1, nanoscale feature 104, within trench 113c is now deposited a neutral "brush", "mat", or "SAM" layer 114. As is known in the art, all DSA flows require a neutral layer ("brush", "mat", or "SAM") on which the BCP can be coated. The neutral layer provides the surface energy required to induce pattern formation. Due to its presence within the trench 113c, the neutral brush layer 114 is provided in an ovular shape matching the shape of the trench 113c. In some embodiment, the neutral brush layer material may be deposited over an entirety of the substrate, and then excess brush material outside of the trench 113c may be rinsed away (due to the presence of the B-block attracting layer 111, only the region where B-block attracting layer has been etched away will be grafted with the neutral brush material), resulting in the neutral brush layer 114 structure illustrated in nanoscale feature 104.

Continuing now with the description of this embodiment in FIG. 1, nanoscale feature 105, deposited on A or B-block attracting layer 111 and neutral brush layer 114 is block copolymer (BCP) layer 116. In some embodiments, the BCP layer 116 has a thickness from about 15 nanometers to about 45 nanometers. In some embodiments, the BCP layer 116 has a thickness from about 20 nanometers to about 35 nanometers. The block copolymer is a long chain molecule composed of "blocks" of at least two different components, and may have a form such as AAAAAAAAAAAAABBBBBBBBBBBBBB, where "A" represents a first component and "B" represents a second component (hence the previous notation of A or B-block attracting layer 111). In some embodiments, the BCP 116 may include more than two components. For example, the BCP 116 may have a form such as AAAAAABBBBBBBBBBBBBBBCCCCCCC, where "C" represents a third component. In some embodiments, the BCP layer is made from a polystyrene-block-poly(methyl methacrylate) (PS-b-PMMA) material. As a result of directed self-assembly, the blocks arrange to form useful features, such as lines, cylinders, or other structures.

In some embodiments, an annealing approach may be used to perform the DSA process. For example, a thermal, or a solvent-based annealing process, or laser-facilitated annealing process, or a combination of these aforementioned annealing techniques may be employed, as is known in the art. After DSA, due to the strongly preferential interaction between B-block (of the BCP layer 116) and B-block attracting layer 111, the desired directed self-assembly nanopattern will be formed. For example, the BCP may form horizontally oriented, lamellae-like morphology on the x-PMMA region 111, while the neutral brush 114 covered region enables the formation of perpendicularly-orientated B-block cylinders 115, as shown in nanoscale feature 105. The B-block cylinders 115 may be selectively removed through UV exposure and wet development, resulting in holes of A-block polymer film for subsequent pattern transfer for contact holes or vias.

Thereafter, the integrated circuit may be completed using known "middle-of-the-line" (MOL) processes and "back-end-of-the-line" (BEOL) processes. The present disclosure is not intended to exclude any such further processes as are conventional in the fabrication of conventional integrated circuits and semiconductor chips.

Turning now to FIG. 2, illustrated is a process flowchart illustrating another exemplary embodiment of a method for directed self-assembly (DSA) using chemoepitaxy in the design and fabrication of integrated circuits. In particular, FIG. 2 shows a series of nanoscale design features 201-204 that show various steps in the fabrication of an integrated circuit. With attention first to nanoscale feature 201, a base layer 210 is initially provided. Base layer 210 provides a support base on which the DSA patterning may occur. For example, in some embodiments, base layer 110 is a combination of a plurality of individual layers. These layers may include, for example, a semiconductor substrate, an organic planarization layer (OPL), and an anti-reflective coating (ARC) layer. With regard to the semiconductor substrate, briefly, the semiconductor substrate is defined to mean any construction formed of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate may further include a plurality of isolation features (not shown), such as shallow trench isolation (STI) features or local oxidation of silicon (LOCOS) features. The isolation features may define and isolate the various microelectronic elements (not shown), also referred to herein as active integrated circuit structures. Disposed on the semiconductor substrate may be the aforementioned organic planarization layer (OPL). In some embodiments, OPL has a thickness ranging from about 20 nanometers to about 100 nanometers. In some embodiments, the OPL has a thickness ranging from about 45 nanometers to about 65 nanometers. The OPL serves to create a more level surface patterning. It may also have some optically absorbing components, and thus may also behave like an antireflective coating. It may also have some etch resistant elements, and thus may also behave like a hard mask. Furthermore, disposed on the OPL may be the aforementioned antireflective coating (ARC) layer. In some embodiments, the antireflective coating layer is a silicon-based antireflective coating (SiARC). In some embodiments, a SiARC layer having a thickness from about 10 nanometers to about 40 nanometers is used. In some embodiments, a SiARC layer having a thickness from about 15 nanometers to about 25 nanometers is used.

With continued reference to FIG. 2, nanoscale feature 201, disposed on the base layer 210 may be provided a photoresist material layer 212. The photoresist material layer 212 is then patterned by exposure to a light source using known photolithographic processes. Any type of lithography may be employed: for example, 193 nm dry or immersion, EUV, e-beam, and others known in the art. The patterning is performed so as to expose the photoresist material layer 212 in an area that is generally ovular in shape. The patterning process results in an ovular trench 213a formed within the photoresist material layer 212, thereby exposing an upper surface of the base layer 210 in an ovular area corresponding to the trench 213a.

With reference now to FIG. 2, nanoscale feature 202, within trench 213a and over the photoresist material layer 212 is now deposited a neutral "brush", "mat", or "SAM" layer 214. As is known in the art, all DSA flows require a neutral layer ("brush", "mat", or "SAM") on which the BCP can be coated. The neutral layer provides the surface energy required to induce pattern formation. Due to its presence within the trench 213a, the neutral brush layer 214 is provided in an ovular shape matching the shape of the trench 213a. With the neutral brush layer 214 now filling part of the trench, the trench having a reduced depth as shown in nanoscale feature 202 will now be referred to as trench 213b. The neutral brush layer material being deposited over an entirety of the photoresist material layer 212 and within the trench thus covers an entirety of the IC at this stage of the fabrication process. In some embodiments, flood exposure of the photoresist material 212 may be performed prior to the deposition of the neutral brush layer 214 to ensure that the post-lithographic resist pattern will not be dissolved during the herein described coating step of neutral layer material.

With continued reference to FIG. 2, nanoscale feature 203, the photoresist material of layer 212 (and the neutral material of layer 214 coated thereover) may be stripped away using an appropriate solvent, as will be appreciated by those having ordinary skill in the art. This leaves only the portion of the neutral material layer 214 that was within the trench left in place over the base layer 210. Thus, due to its presence within the trench, the neutral brush layer 214 is provided in an ovular shape matching the shape of the trench. The ovular neutral brush layer also rises above the base layer 210, at a height corresponding to the original thickness of the neutral brush layer 214 as coated.

Continuing now with the description of this embodiment in FIG. 2, nanoscale feature 204, deposited on base layer 210 and neutral brush layer 214 is block copolymer (BCP) layer 216. In some embodiments, the BCP layer 216 has a thickness from about 15 nanometers to about 45 nanometers. In some embodiments, the BCP layer 216 has a thickness from about 20 nanometers to about 35 nanometers. The block copolymer is a long chain molecule composed of "blocks" of at least two different components, and may have a form such as AAAAAAAAAAAAABBBBBBBBBBBBBB, where "A" represents a first component and "B" represents a second component. In some embodiments, the BCP 216 may include more than two components. For example, the BCP 216 may have a form such as AAAAAABBBBBBBBBBBBBBBBCCCCCCC, where "C" represents a third component. In some embodiments, the BCP layer is made from a polystyrene-block-poly(methyl methacrylate) (PS-b-PMMA) material. As a result of directed self-assembly, the blocks arrange to form useful features, such as lines, cylinders 215, or other structures.

In some embodiments, an annealing approach may be used to perform the DSA process. For example, either a thermal or solvent-based annealing process may be employed, as is known in the art. After DSA, due to the strongly preferential interaction between B-block and the base layer 210 (such as the aforementioned Si-ARC layer thereof), a directed self-assembly nano-pattern will be formed. For example, the BCP may form a horizontally oriented, lamellae-like morphology on the non-neutral layer (214)-covered region, while the neutral layer (214)-covered region enables the perpendicular orientation of the B-block microdomains (such as cylinders 215). The B-block microdomains (such as cylinders 215) may be selectively removed through UV exposure and wet development, resulting in holes of A-block polymer film for subsequent pattern transfer for contact holes or vias. The pattern might also be transferred through etching methods such as reactive ion etching (RIE) by tuning the etching chemistry based on the etch contrast between the A and the B block.

Thereafter, the integrated circuit may be completed using known "middle-of-the-line" (MOL) processes and "back-end-of-the-line" (BEOL) processes. The present disclosure is not intended to exclude any such further processes as are conventional in the fabrication of conventional integrated circuits and semiconductor chips.

Accordingly, the present disclosure has provided methods for directed self-assembly (DSA) using chemoepitaxy in the design and fabrication of integrated circuits. The described methods provide a simple, cost effective strategy for a directed self-assembly process that overcomes the problems encountered in prior art methods. In particular, described embodiments provide DSA methods that are less sensitive to filling conditions and material selections, and that allow for varied pitches and design configurations.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

The invention claimed is:

1. A method for directed self-assembly in the fabrication of an integrated circuit comprising:
    forming an A or B-block attracting layer over and in physical contact with a base semiconductor layer;
    forming a trench in the A or B-block attracting layer to expose a portion of the base semiconductor layer, wherein forming the trench in the A or B-block attracting layer comprises forming a photoresist material over the A or B-block attracting layer and forming a patterned opening in the photoresist material in the shape of the trench, wherein the patterned opening in the photoresist material is formed using 193 nm lithography, and wherein forming the trench in the A or B-block attracting layer further comprises etching the A or B-block attracting layer within the patterned opening in the photoresist material, said etching the A or B-block attracting layer causing the patterned opening in the photoresist material to be directly transferred into the A or B-block attracting layer;
    forming a neutral surface coating comprising a brush or mat or self-assembled monolayers coating within the trench and over and in physical contact with the base semiconductor layer, wherein the neutral surface coating has the shape of the trench and is surrounded by the A or B-block attracting layer, wherein an upper surface of the A or B-block attracting layer and an upper surface of the neutral surface coating form a continuous planar upper surface;
    forming a block copolymer layer over and in physical contact with the continuous planar upper surface so as to be formed over and in physical contact with the neutral surface coating and formed over and in physical contact with the A or B-block attracting layer, wherein the block copolymer layer comprises a block copolymer material comprising at least an A block and a B block;
    annealing the block copolymer layer to form a directed self-assembly nano-pattern within the block copolymer layer, wherein the annealing causes one of the A block or the B block to self-assemble into a plurality of cylinders oriented perpendicularly with respect to the continuous planar upper surface in an area of the block copolymer layer directly overlying and in physical contact with the neutral surface coating, said plurality of cylinders consisting of the one of the A block or the B block, wherein the annealing causes the other of the A block or the B block to entirely surround each of the plurality of cylinders such that said other of the A block or the B block has a perimeter in the shape of the trench in the area of the block copolymer layer directly overlying and in physical contact with the neutral surface coating, said perimeter enclosing therewithin the plurality of cylinders, and wherein the annealing causes the block copolymer layer in areas outside of said perimeter to form lamellar layers of the A block and the B block horizontally with respect to the continuous planar upper surface; and
    etching the plurality of cylinders to form a plurality of cylindrical openings within said other of the A block or the B block, and further etching to transfer a pattern of the plurality of cylindrical openings into the base semiconductor layer and form a plurality of openings in the base semiconductor layer, said plurality of openings in the base semiconductor layer comprising contact or via openings of the integrated circuit.

2. The method of claim 1, wherein forming the A or B-block attracting layer over the base semiconductor layer comprises forming the A or B-block attracting layer over a base semiconductor layer comprising a semiconductor substrate.

3. The method of claim 2, wherein forming the A or B-block attracting layer over the base semiconductor layer comprises forming the A or B-block attracting layer over a base semiconductor layer comprising an organic planarization layer.

4. The method of claim 3, wherein forming the A or B-block attracting layer over the base semiconductor layer comprises forming the A or B-block attracting layer over a base semiconductor layer comprising an anti-reflective coating layer.

5. The method of claim 4, wherein forming the trench in the A or B-block attracting layer to expose the portion of the base semiconductor layer comprises forming the trench in the A or B-block attracting layer to expose a portion of the anti-reflective coating layer.

6. The method of claim 1, wherein forming the block copolymer layer comprises forming a polystyrene-block-poly(methyl methacrylate) block copolymer layer.

7. The method of claim 1, wherein annealing the block copolymer layer comprises thermal annealing or solvent annealing.

8. The method of claim 1, wherein the trench is formed in an ovular shape.

* * * * *